(12) United States Patent
Sobolewski

(10) Patent No.: US 12,742,819 B2
(45) Date of Patent: Sep. 22, 2026

(54) SOLDERLESS HIGH CURRENT, HIGH VOLTAGE, HIGH BANDWIDTH TEST FIXTURE

(71) Applicant: Keithley Instruments, LLC, Solon, OH (US)

(72) Inventor: Gregory Sobolewski, Brecksville, OH (US)

(73) Assignee: Keithley Instruments, LLC, Solon, OH (US)

( * ) Notice: Subject to any disclaimer, the term of this patent is extended or adjusted under 35 U.S.C. 154(b) by 660 days.

(21) Appl. No.: 18/108,491

(22) Filed: Feb. 10, 2023

(65) Prior Publication Data

US 2023/0251311 A1 Aug. 10, 2023

Related U.S. Application Data

(60) Provisional application No. 63/308,918, filed on Feb. 10, 2022.

(51) Int. Cl.
*G01R 31/319* (2006.01)
*G01R 1/073* (2006.01)
*G01R 31/28* (2006.01)

(52) U.S. Cl.
CPC ... *G01R 31/31905* (2013.01); *G01R 1/07342* (2013.01); *G01R 31/2818* (2013.01)

(58) Field of Classification Search
CPC .......... G01R 1/02; G01R 1/04; G01R 1/0408; G01R 1/0433; G01R 1/0441;

(Continued)

(56) References Cited

U.S. PATENT DOCUMENTS

2002/0158645 A1 10/2002 Chou et al.
2004/0066207 A1* 4/2004 Bottoms ............ G01R 31/2886 324/754.07

(Continued)

FOREIGN PATENT DOCUMENTS

WO 2011087764 7/2011

OTHER PUBLICATIONS

Korean Intellectual Property Office, International Search Report and Written Opinion for International Application No. PCT/US2023/012846, Jun. 8, 2023, 8 pages, Daejeon, Republic of Korea.

*Primary Examiner* — Huy Q Phan
*Assistant Examiner* — David B Frederiksen
(74) *Attorney, Agent, or Firm* — Miller Nash LLP; Andrew J. Harrington; Krista Y. Chan

(57) ABSTRACT

A test fixture for coupling a Device Under Test (DUT) to a measurement instrument includes a device interface board, which may be a solderless, press-fit board, for electrically connecting to one or more DUTs, a power delivery section electrically coupled to the device interface board through a series of electrical contacts, a measurement interface section electrically coupled to the device interface board through a second series of electrical contacts, the measurement interface structured to be coupled to the measurement instrument, and a metal plate coupled between and providing an electrical return path between the measurement interface and the power delivery section. The metal plate is sized and shaped to provide physical protection from DUTs that are destroyed during testing.

20 Claims, 8 Drawing Sheets

(58) Field of Classification Search

CPC ........ G01R 1/0466; G01R 1/06; G01R 1/067; G01R 1/073; G01R 1/07307; G01R 1/07342; G01R 31/26; G01R 31/2601; G01R 31/2607; G01R 31/28; G01R 31/2801; G01R 31/2818; G01R 31/319; G01R 31/31903; G01R 31/31905

See application file for complete search history.

(56) References Cited

U.S. PATENT DOCUMENTS

2004/0217769 A1* 11/2004 DiOrio ................. G01R 1/0483 324/750.22
2005/0194989 A1* 9/2005 Delucco ........... G01R 31/31924 324/756.05
2005/0289415 A1* 12/2005 Dean ...................... G11C 29/56 714/724
2006/0132165 A1* 6/2006 Walker ............. G01R 31/31924 324/750.3
2006/0157703 A1* 7/2006 Kodama .............. G01R 31/002 257/48
2006/0202709 A1 9/2006 Norris et al.
2006/0220671 A1* 10/2006 Devey ................ G01R 31/2889 324/755.05
2007/0186131 A1* 8/2007 Goodrich ........... G01R 31/2889 714/724
2007/0190823 A1* 8/2007 Cuevas .............. H01R 13/6586 439/98
2008/0079450 A1* 4/2008 Dean .................. G01R 31/2886 324/754.07
2011/0080187 A1* 4/2011 Hotz .................. G01R 31/2889 324/763.02
2013/0044033 A1* 2/2013 Nickel ................... G01R 29/10 343/703
2013/0229200 A1 9/2013 Lou et al.
2014/0009181 A1 1/2014 Xue et al.
2017/0023633 A1* 1/2017 Song .................. G01R 31/2879
2019/0324082 A1* 10/2019 Mao ................. G01R 31/31903
2020/0003802 A1* 1/2020 Lee ...................... G01R 1/0466
2022/0272834 A1* 8/2022 Westwood ........... G01R 1/0483

* cited by examiner

SOLDERLESS HIGH CURRENT, HIGH VOLTAGE, HIGH BANDWIDTH TEST FIXTURE

CROSS-REFERENCE TO RELATED APPLICATIONS

This disclosure claims benefit of U.S. Provisional Application No. 63/308,918, titled "SOLDERLESS HIGH CURRENT, HIGH VOLTAGE, HIGH BANDWIDTH INTERFACE FOR A DEVICE UNDER TEST," filed on Feb. 10, 2022, the disclosure of which is incorporated herein by reference in its entirety.

TECHNICAL FIELD

This disclosure relates to test and measurement systems, and more particularly to a test fixture for connecting a device under test to a test and measurement system.

BACKGROUND

High power devices, such as metal-oxide-semiconductor field-effect transistors (MOSFETs), require many measurements for full characterization. These devices are typically characterized using multiple test stands, each test stand optimized for specific types of measurements. In general, these test stands can be described as either static or dynamic measurement platforms.

U.S. patent application Ser. No. 17/688,733, filed Mar. 7, 2022, entitled UNIFIED MEASUREMENT SYSTEM FOR STATIC AND DYNAMIC CHARACTERIZATION OF A DEVICE UNDER TEST, the contents of which are hereby incorporated by reference, describe systems and methods that allow merging of both static and dynamic measurements of a Device Under Test (DUT) into one test system platform, eliminating the need for multiple test stands, which decreases the accuracy of device characterization. Such a combined static and dynamic test system platform depends on a DUT interface, or fixture, that can allow full set of measurements without any compromise, and may be particularly useful for testing wide bandgap DUTs. To accomplish this combination of static and dynamic testing, the DUT interface needs to satisfy a number of test requirements such as high current handling, high voltage handling, high bandwidth, and low leakage. Conventional interfaces do not provide these capabilities, and developing an interface that satisfies all of the test requirements has proven to be difficult. For example, sockets to receive DUTs typically fail at least one of the testing requirements. To date, there is no single test fixture that allows full device characterization of high power semiconductor devices.

Embodiments of the disclosure address these and other deficiencies in the prior art.

DESCRIPTION

Figure 1:
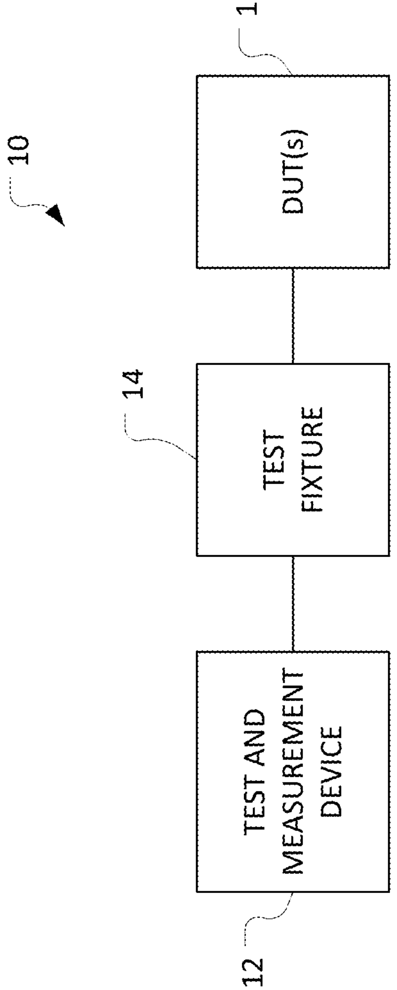
FIG. 1 is a block diagram illustrating a measurement environment including a test fixture having high current capability, high voltage capability, and high bandwidth capability, according to embodiments of the disclosure.

FIG. 1 is a block diagram illustrating a measurement environment 10 including a test fixture 14, through which a test and measurement device 12 couples to a Device Under Test (DUT) 16. As described below, the test fixture 14 accepts a DUT 16, and then characterization tests are performed on the DUT by the test and measurement device 12. Since the DUT 16 may be a high power MOSFET device, the test fixture 14 must be able to withstand a rigorous testing environment, and, as described below, has a high current capability, a high voltage capability, and a high bandwidth capability.

Figure 2:
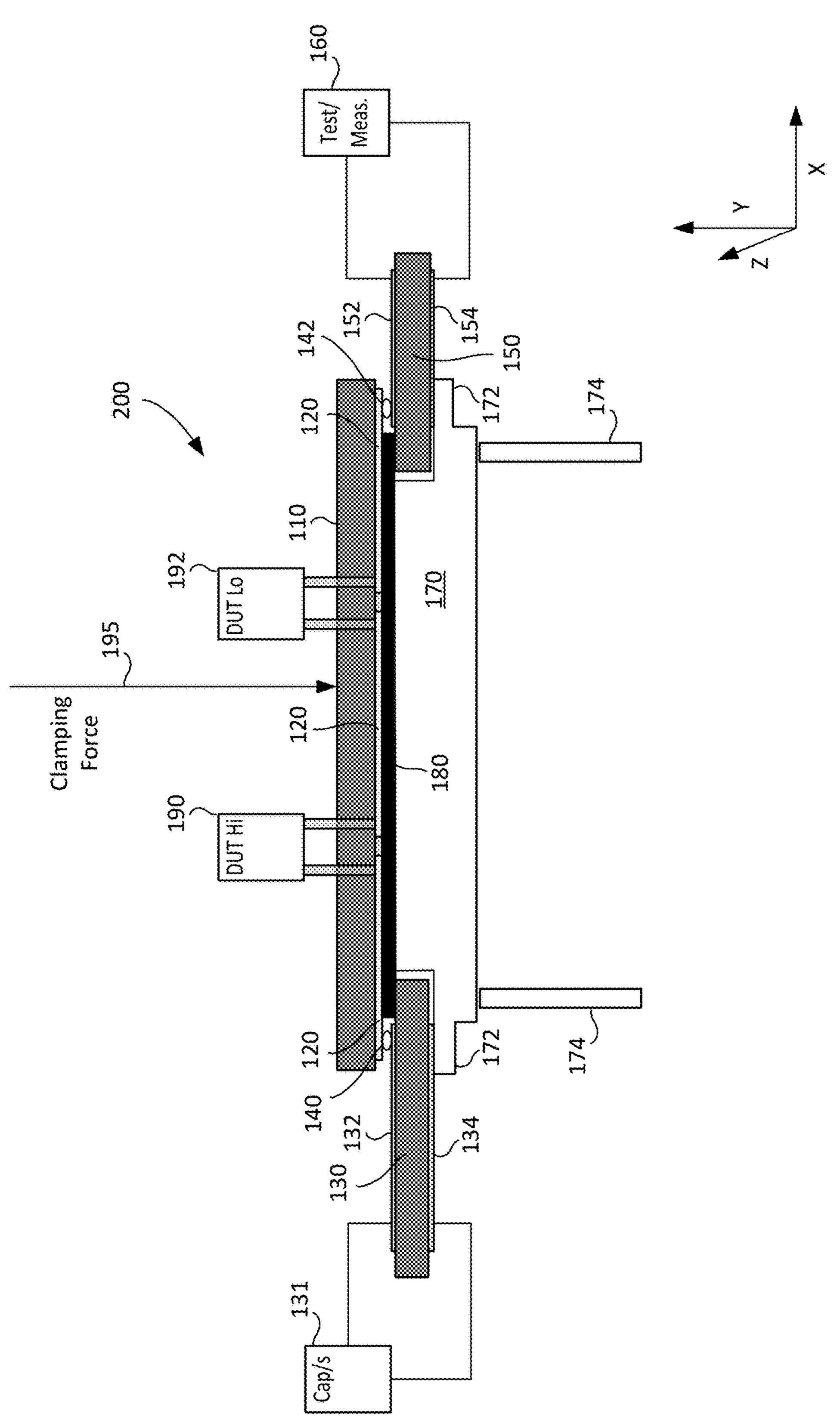
FIG. 2 illustrates an arrangement of components making an example test fixture, according to embodiments of the disclosure.

FIG. 2 illustrates an example test fixture 200 according to embodiments of the disclosure. The test fixture 200 is generally formed from a layered arrangement of physical components that together allow a DUT to be safely, accurately, and comprehensively tested by a test and measurement device. FIG. 2 illustrates two DUTs, 190, 192, which are electrically coupled to the test fixture 200. In the illustrated embodiment, the DUTs 190, 192 are high-powered MOSFETs, such as those formed with wide bandgap materials, but embodiments of the disclosure can operate with other types of electrical components as well, and are not limited to testing high-powered MOSFETs. Although two DUTs 190, 192 are illustrated, embodiments of the test fixture 200 can accommodate between 1-10 DUTs. In FIG. 2, The DUTs 190, 192 are coupled together through the test fixture 200 to create half-bridge rectifier. Although the DUTs 190, 192 are not shown in cross-section, the components of the test fixture 200 are shown in cross-section, although not necessarily to scale, but rather are illustrated to highlight relative positions and connections.

In general, the test fixture includes a DUT Printed Circuit Board (PCB) 110, also referred to as a device interface board, upon which the DUTs 190, 192 are physically mounted. The mounts may be solderless, or the DUTs 190, 192 may be soldered to the test fixture 200. Although illustrated here as being mounted perpendicular to the DUT PCB 110, in some embodiments the DUTs 190, 192 may be mounted in parallel, or at another angle, to the DUT PCB 110. The main body of the DUT PCB 110 is insulative, and therefore provides at least some level of electrical isolation for the DUTs 190, 192.

Directly underneath the DUT PCB 110 is an electrical plane. Although it can be made from any metal, the electrical plane is preferable made of copper, copper alloy, brass, or any other conductive metal, and is referred to herein as a copper plane 120. Of course, as copper is a conductive metal, the copper plane 120 is used for carrying electrical signals between the DUTs 190, 192 and a test device.

Figure 6:
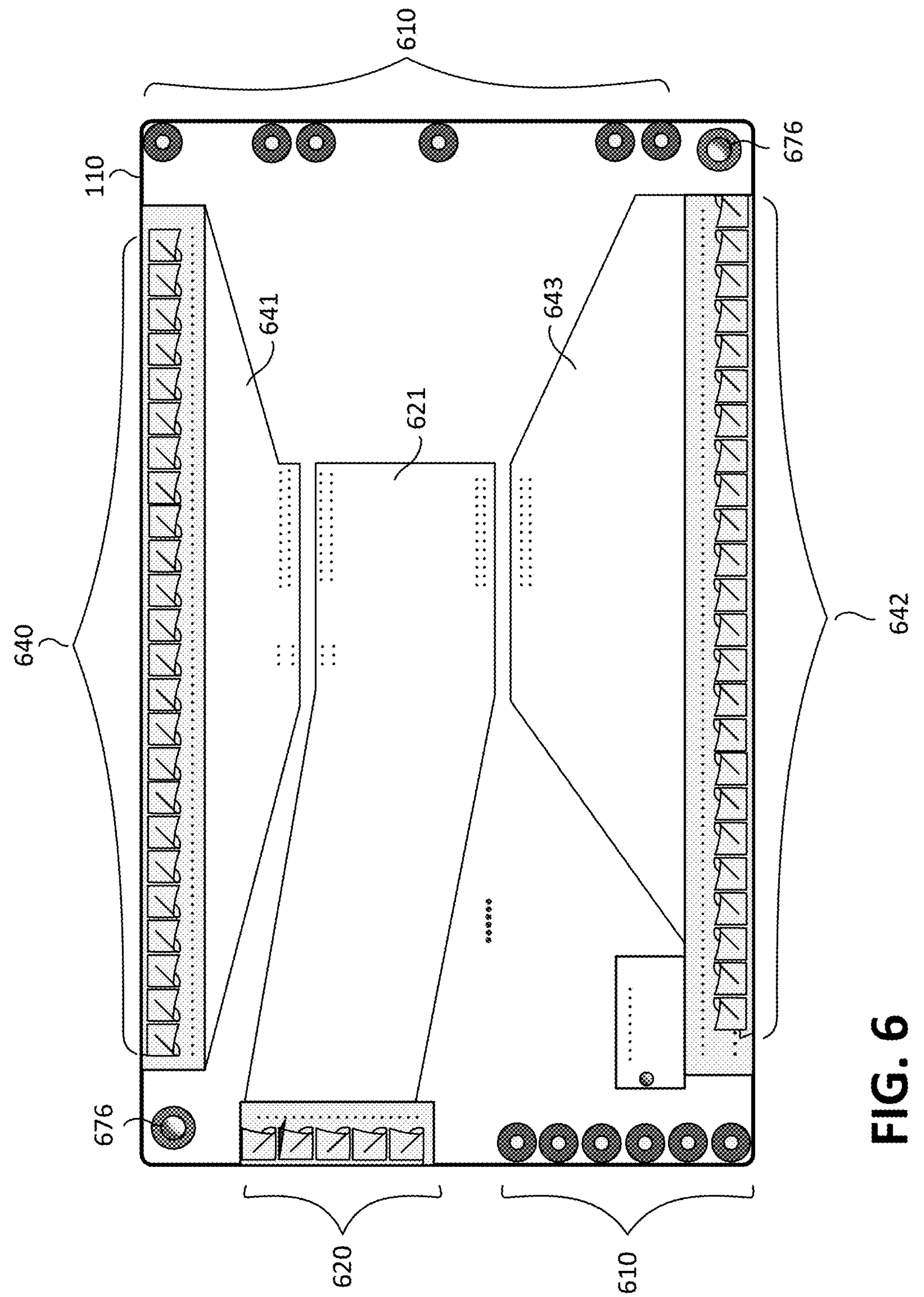
FIG. 6 illustrates a bottom surface of an example component of test fixtures illustrated in FIGS. 2-5, according to embodiments of the disclosure.

A power delivery section 130 is formed on a substrate, such as a PCB substrate. One or more capacitors 131 may be coupled to the power delivery section 130 to provide power during testing of the DUTs 190, 192. Although capacitors 131 are one source of power that may be used for testing the DUTs 190, 192, other sources of power are also possible, such as from a test-bench power plug, or regulated power derived from such wall power, or from a separate, power-generating device. For convenience, this disclosure refers to and illustrates the power source as one or more capacitors 131, but the test fixtures described herein are not limited to capacitors, and instead may be powered by any suitable power source. One conductor of the power delivery section 130, referred to as a top conductor 132, couples the power delivery section to the copper plane 120 through a contact 140. In one embodiment, the contact 140 is formed from multiple individual contacts, and not the single contact illustrated in FIG. 1. An example of a contact array is illustrated in FIG. 6, described below. In any event, the contact 140 is structured to electrically couple the top conductor 132 to the copper plane 120. The capacitor 131 is used as a high voltage source for the test fixture 200 and is capable of being charged to a relatively high voltage, such as in excess of 1000 Volts. And the contact 140 is structured to handle such high voltage. Another conductor of the power delivery section 130 is referred to as a bottom conductor 134, and is described in more detail below.

Opposite the power delivery section 130 on the test fixture 200 is another structure, a measurement coupler 150, which provides a return path as the energy from the capacitor 131 is being discharged through the DUTs 190, 192. The measurement coupler 150 also couples the test fixture 200 to a measurement device 160. In more detail, a contact 142 couples the output path from the DUT 192 to a top return conductor 152 of the measurement coupler 150. The measurement coupler 150 includes a physical connection to measurement device 160, which may be made through a carrier PCB (not illustrated) from the measurement device. The measurement device 160 is also coupled to a bottom return conductor 154 of the measurement coupler 150. This arrangement allows the measurement device 160 to make measurements, such as current and voltage, etc., as the DUTs 190, 192 operate. After returning from the measurement device, the measurement coupler 150 includes a return electrical path back to the bottom conductor 134 of the power delivery section 130. More specifically, the bottom return conductor 154, made of an electrically conductive material, couples the measurement coupler 150 to a relatively large metal plate 170. The metal plate 170 is physically large and allows a large amount of energy to be dissipated through the test fixture 200. The metal plate 170 electrically couples the bottom return conductor 154 of the measurement coupler 150 to the bottom conductor 134 of the power delivery section 130. In some embodiments the metal plate 170 may include edges or lips 172 to facilitate soldering or attaching the test fixture 200 to another PCB. Similarly, optional alignment pins 174 may be present to help align the test fixture 200 to such a PCB. The presence of the metal plate 170 in the test fixture 200 provides many advantages. For example, sometimes DUTs physically fail with a large amount of energy. Having a large metal plate 170 helps strengthen the test fixture 200 as well as provides physical protection between the DUTs 190, 192 and any other device opposite the test fixture. The metal plate 170 also protects the main circuitry in the test fixture 200 and provides a robust return path for the testing circuit. Other advantages of the metal plate 170 are described below. The metal plate 170 may be formed of copper, brass, or other similar metal or alloy, for example. In some embodiments the metal plate 170 is between approximately 1-15 mm thick and preferably between approximately 5-10 mm thick. Approximately as used in this disclosure means within +/−20%.

In most embodiments, the metal plate 170 is separated from the copper plane 120 by an insulator 180. The insulator 180 may be any insulator suitable for the testing purposes. For example, for relatively high voltage insulation, the insulator 180 may be formed of Teflon or other material capable of withstanding voltages in excess of 1000 Volts. Aerogel may also be used as an insulator 180, especially if thermal insulation properties are important. In relatively low voltage testing environments, an air gap may be used as its own insulator. In other words, in those embodiments, no insulator 180, other than the air gap, would be present between the metal plate 170 and the copper plane 120. This embodiment is illustrated and described below with reference to FIG. 5.

Referring back to FIG. 2, the test fixture 200 includes a full electric circuit starting from the capacitor 131, through the power delivery section 130, extending through the DUTs 190, 192, through the measurement coupler 150, which allows the DUTs to be measured through the measurement device 160, through the large metal plate 170, back to the bottom conductor 134, which is, in turn, coupled back to the capacitor 131. This test fixture 200 allows the DUTs 190, 192 to be fully characterized by the measurement device 160, also known as static and dynamic testing, without the need for moving the DUTs between multiple test fixtures.

Several advantages in testing environments are facilitated through use of the test fixture 200. For example, test fixtures must be able to withstand high testing currents, oftentimes in excess of 1-3 kA. The test fixture 200 handles large currents by using long strips of electricmagnetic interference (EMI)/shielding contacts to provide maximum contact area for current flow. Components with large contact areas include the copper plane 120 as well as the metal plate 170. Even the top conductor 132 and bottom conductor 134 of the power delivery section 130, as well as the top return conductor 152 and bottom return conductor 154 of the measurement coupler 150 are sized to carry up to several kiloamps of current. Further, the contacts 140, 142 are selected for high current ratings. Thus, all of the components of the test fixture 200 are formed of materials to withstand currents in excess of 1 kA. If particular of the contacts need to withstand higher amounts of current, these contacts can be replaced with other high density/high current contact interfaces that allow for minimal spacing between contact surfaces.

High voltage handling capability, in excess of 5000 Volts, and, in some cases up to 10 kV is met by selecting the material and thickness of insulator 180 to withstand these high voltages. In test fixture designs having the highest voltage capabilities, the insulator 180 may be up to 1 mm thick, and formed of Polymers such as TEFLON or KAPTON, materials such as Silicone, or other insulative material that is capable of withstanding exposure to high voltages. If such high voltages are not needed, other insulative materials may be selected instead. In some low voltage testing scenarios, or when low cost is a concern, the insulator 180 may be omitted. In other words, in these embodiments, the insulator 180 is an air gap between the metal plate 170 and the copper plane 120, or even the insulative properties of a PCB may be used, described below with reference to FIG. 5.

The test fixture 200 is rated for high testing bandwidths. One part of increasing testing bandwidth is to minimize inductance of the test fixture 200. In some designs, inductance may be kept at a minimum by using a relatively thin insulator 180, such as one having a maximum thickness of tens of microns, such as 5-50 μm. As described above, in some embodiments the insulator 180 is omitted entirely. In these embodiments the inductance of the test fixture 200 may be as low as <1 nH. Another factor in bandwidth is by having a small, or tight, testing loop. As described above, the loop from the capacitor 131, through the DUTs 190, 192, through the measurement coupler 150 and back to the capacitor 131 is relatively short. For instance, with reference to FIG. 2, the size of the DUT PCB 110 may be between 5-15 cm wide (x-direction), and 10-20 mm deep (z-direction), and preferably approximately 10 mm×15 mm. The thickness of a standard PCB is approximately 1.6 mm. Having such a short current path allows the testing bandwidths of the test fixture 200 to remain high, with the highest bandwidths on the order of 500 MHz-1.2 GHz.

Another factor in quality of test fixtures is having low leakage, such as less than 1 nA. The test fixture 200 has extremely low leakage by using the return path, from the measurement coupler 150 to the power delivery section 130, through the metal plate 170, as the guard to prevent leakage from high voltage signals between the capacitor 131 and the DUTs 190, 192. Further, the insulator 180 may be chosen to minimize current leakage. In some embodiments, channels or cuts in PCBs, such as the DUT PCB 110 may also work to prevent current leakage.

Yet another factor in a versatile and powerful test fixture is the ability to accept a wide range of devices, such as Surface Mount Technology (SMT) devices, Transistor Outline (TO) devices, 34 mm and 62 mm devices, etc. The test fixture 200 provides support for multiple devices by utilizing a relatively planar construction that has a landscape form factor. In other words, the test fixture 200 is relatively wider that it is tall, or thick, which allows DUTs of many varying sizes to be mounted to the top surface of the test fixture.

Additional features and variations of test fixtures according to embodiments are explained with reference to FIGS. 2-7. Referring back to FIG. 2, one feature of the test fixture 200 not discussed above is that the distance between the DUT PCB 100 and the top of the power delivery section 130 is not dependent on the thickness of the metal plate 170, but instead may be individually controlled by the spacing of the insulator 180 and the height of the contacts 140, 142.

Also, in addition to being formed of robust parts, some of the components of the test fixture 200 are relatively easy to replace, such as the DUT PCB 110. Preferably, the DUT PCB 110 is coupled to the remainder of the test fixture 200 through solderless connections, and may make electrical connections merely by being pressed or clamped into a main body of the test fixture. With reference to FIG. 2, the DUT PCB 110 may be manually positioned on the insulator 180 and near the metal plate 170. Then a clamping force 195 may be used to press the DUT PCB 110 into the test fixture 200, and specifically to create an electrical connection between the contacts 140, 142 and their mating surfaces of the top conductor 132 and top return conductor 152, respectively. The clamping force 195 may be exerted by one or more screws, or by a physical clamp that holds the DUT PCB 110 into the test fixture 200. Also, by being a solderless connection between the DUT PCB 110 and the remainder of the test fixture 200, individual DUT PCBs 110 may be created for particular DUTs 190, 192, or particular types of DUTs, which allows a user to quickly change a test set up between different types of DUTs merely by replacing the particular DUT PCB 110 selected for the DUTs being tested. Additional information of the physical connection between the DUT PCB 110 and test fixtures is provided with reference to FIG. 6 below.

Figure 3:
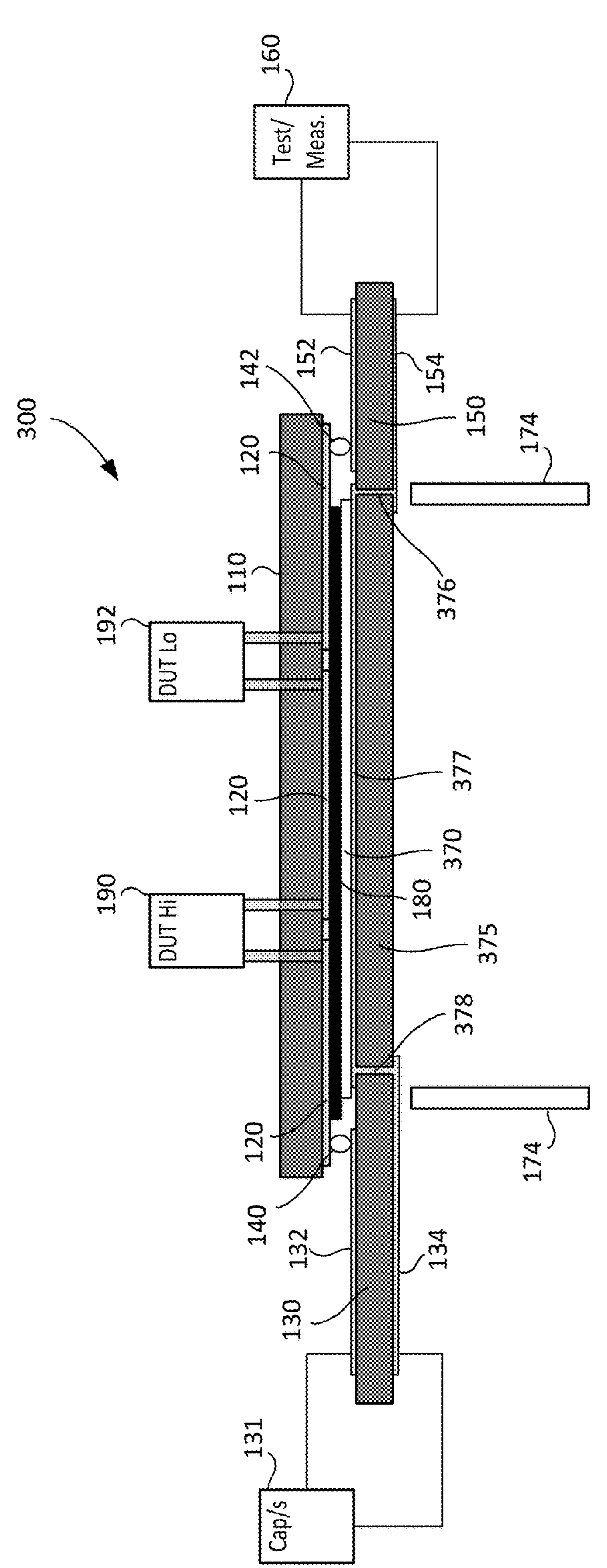
FIG. 3 illustrates another arrangement of components making another example test fixture, according to embodiments of the disclosure.

FIG. 3 illustrates another test fixture 300, which may be similar to the test fixture 200 of FIG. 2. Like components between the test fixtures 200 and 300 are not described, for brevity, and instead only the differences between the test fixtures is discussed. The main difference between the test fixture 300 and test fixture 200 is that the test fixture 300 includes a metal plate 370 that is much thinner and smaller than the metal plate 170 of FIG. 1, although it may be made from the same materials. Vias 376, 378, which may be formed of copper or other metal, electrically couple the measurement coupler 150 to the power delivery section 130 through the metal plate 370. In some embodiments a connector PCB 375 is mounted below the metal plate 370, and the metal plate 370 also directly contacts a copper surface, or trace 377, formed on the connector PCB 375. Using a thinner metal plate 370 in the test fixture 300 rather than the thicker metal plate 170 of FIG. 2 may allow the test fixture 300 to be manufactured more inexpensively than the test fixture 200 of FIG. 2. Additionally, the test fixture 300 may not be as physically robust as the test fixture 200, due to the absence of the metal plate 170, but this may be unimportant in many testing scenarios.

Figure 4:
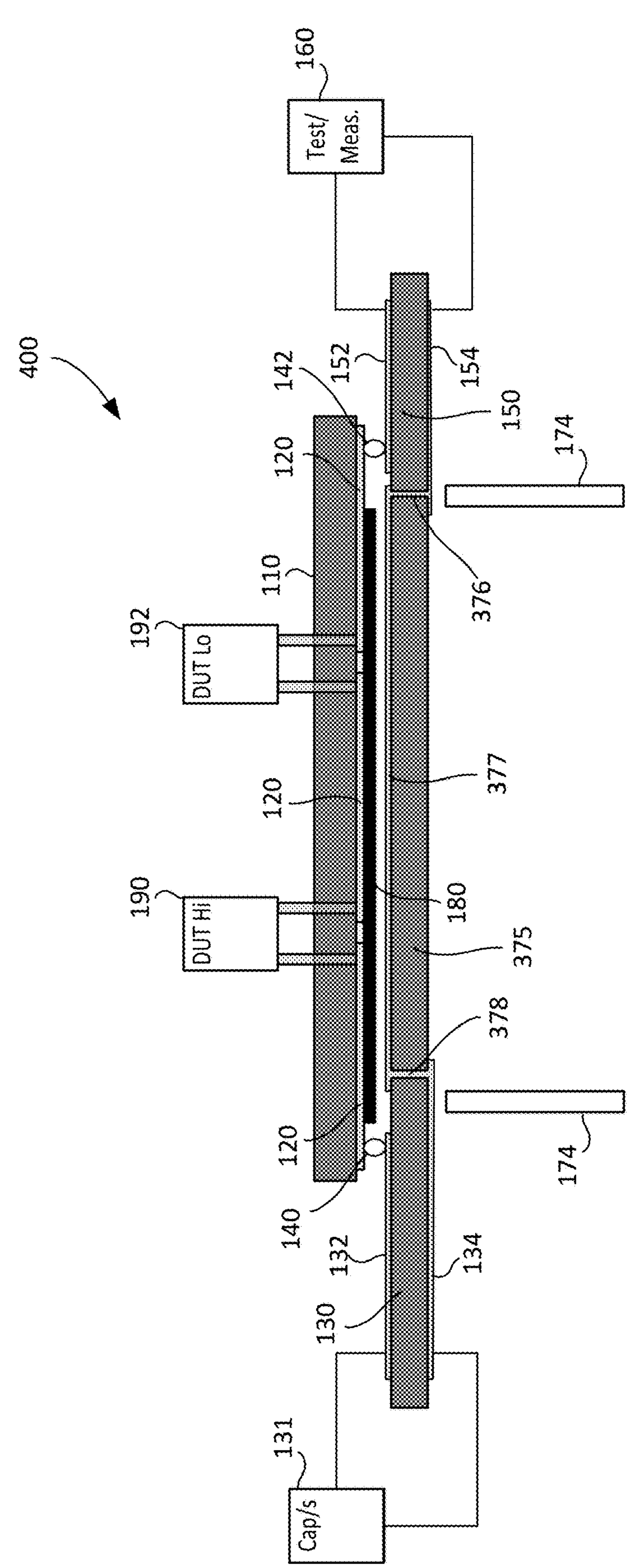
FIG. 4 illustrates yet another arrangement of components making yet another test fixture, according to embodiments of the disclosure.

FIG. 4 illustrates another test fixture 400, which is similar to the test fixture 300 of FIG. 3, except that the metal plate 370 is removed, and only the PCB 375 and its copper trace 377 electrically connects the measurement coupler 150 to the capacitor delivery section 130. This test fixture 400 may be even cheaper to produce than the test fixture 300 of FIG. 3, as it omits the metal plate 370 entirely.

Figure 5:
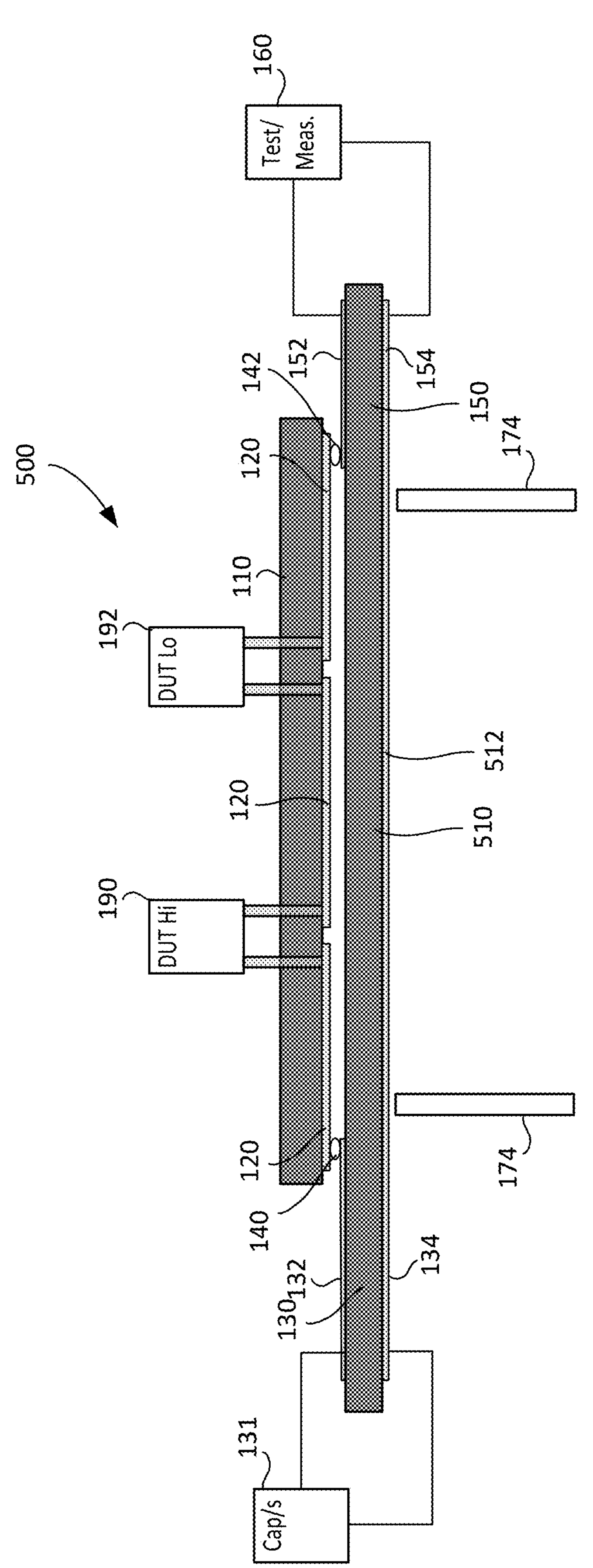
FIG. 5 illustrates still another layered arrangement of components making another test fixture, according to embodiments of the disclosure.

FIG. 5 illustrates yet another test fixture 500, which is similar to the test fixtures above, except that there is no insulator 180 nor any metal plates 170 or 370 present. The power delivery section 130 and measurement coupler 150 are formed on a single PCB 510, which has a copper trace 512 to make the electrical connections between them. The PCB 510 itself provides some insulative properties. This embodiment may be used for lower voltage testing, where the presence of the insulator 180 from the test fixture 200 is not necessary, and instead relies on the insulation of the PCB 510. And, because no metal plate is present, the test fixture 500 may be produced inexpensively.

FIG. 6 illustrates an example of an underside of the DUT PCB 110 component of several of the test fixtures described above. Alignment holes 676 are sized and shaped to receive the alignment pins 174 described above, or perhaps other alignment pins. As described above, contacts 640, 642, which are examples of contacts 140, 142, are not singular contacts, but rather are made from a series or collection of individual contacts. The contacts 640, 642 may be formed of shaped of a copper strips with multiple deformations that flex when downward force is applied to the DUT PCB 110, such as the clamping force 195 (FIG. 2). The multiple deformations cause the strips of copper to have a non-planar shape. Such flexing also helps the copper strips to make a solid electrical connection, as there are many individual points of copper of the contacts 640, 642 sliding across their mating metal surface (for example, top conductor 130 and top return conductor 152 of FIG. 2, respectively). As illustrated in FIG. 6, the copper strips making up the contacts 640, 642 may have a length in excess of 80% of length of an edge of the DUT PCB 110. In other embodiments the copper strips a making up the contacts 640, 642 may have a length in excess of 30% of length of an edge of the DUT PCB 110. Lengths of the copper strips may be chosen based on the electrical properties of the testing environment, such as how much current or voltage is being carried by the strips, and the amount of preferred resistance between the DUT PCB 110 and the remainder of the test fixture.

Contacts 620 electrically couple to the DUT on the top side of the DUT PCB 110 (not illustrated). Thus, the contacts 640, 642, may be "solderless" contacts, meaning it is not necessary to solder the DUT PCB 110 to the remainder of the test fixture to establish electrically connection between the main body of the test fixture and the DUT PCB 110.

Connections 610 on either side of the DUT PCB 110 are also solderless connections, such as pogo pins that are used to electrically and physically connect the DUT PCB 110 to other electrical components of the test fixture that don't need solder or other fixed connection to establish the electrical connection between them. Instead, the electrical connection through contacts 620, 640, 642 may be established merely by pressing the electrical surfaces together. These solderless connections of the DUT PCB 110 allow the PCB to be "press-fit" into place within the test fixture. As mentioned above, the DUT PCB 110 may be secured by a clamp or one or more screws to maintain the electrical connection between the DUT PCB and the remainder of the test fixture. Not needing to solder the DUT PCB 110 to the test fixture, and instead forming the contacts 620, 640, 642 and connections 610 so they are electrically connected without soldering makes it very easy and fast to change between multiple different DUT PCBs.

Also, copper traces 641, 643, and 621 couple the respective contacts 640, 642, 620 to the DUT on the top side of the DUT PCB 110. These copper traces are relatively wide, and provide a relatively wide trace, at least 3-5 mm between the contacts and the DUT. Such a relatively wide width allows these traces to carry the high current that may be sourced to the DUTs.

Also, FIG. 6 illustrates a feature described above, which is that test fixtures according to embodiments have a minimal testing loop through which electrical current is carried. With reference FIGS. 2 and 6, current is carried through the power delivery section 130 through the contacts 640 to a DUT 190, 192 (illustrated in FIG. 2, but occluded in FIG. 6). After passing through the DUT, the current is carried through the contacts 642 to the top return conductor 152. After passing through the measurement device 160, the current then passes through the thick metal plate 172 back to the power deliver section 130. This entire current path is made of robust physical structures, described above, and is minimally sized, described above, which provide a robust test fixture that is capable of sourcing thousands of volts, and amps, to a DUT, in such a way to maximize bandwidth of the testing environment.

Figure 7:
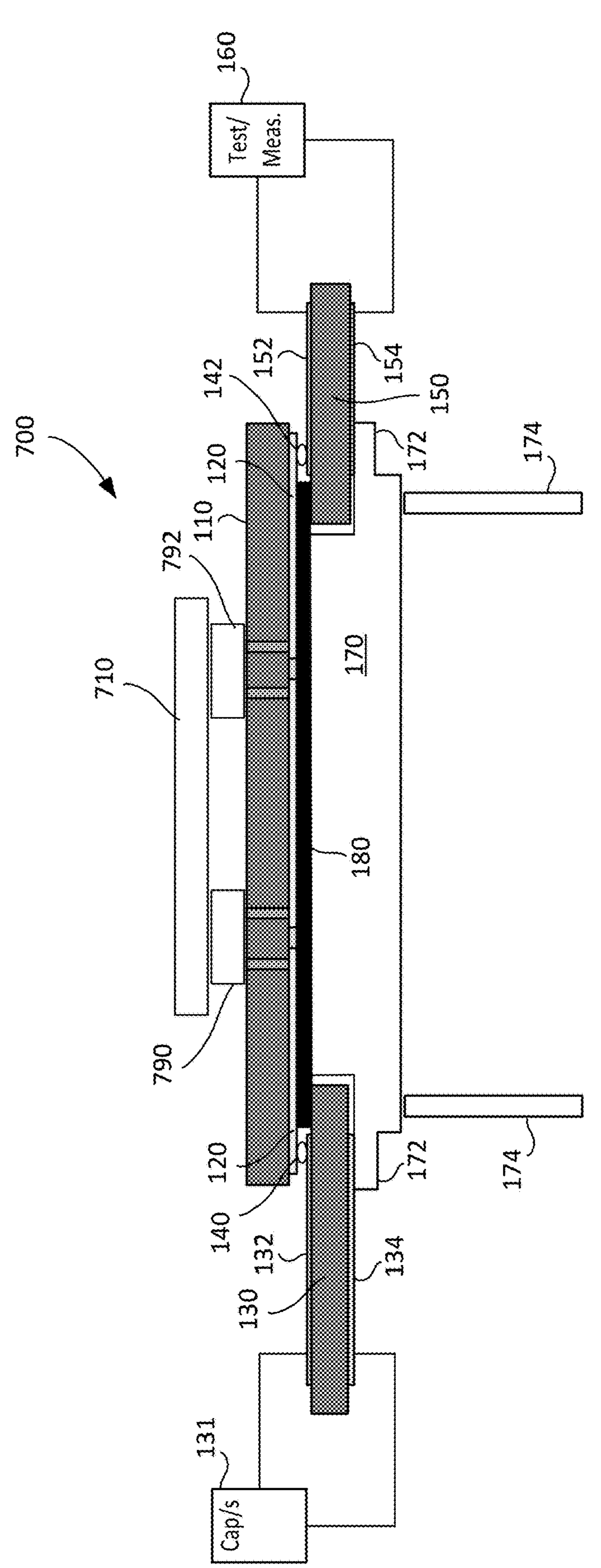
FIG. 7 illustrates a layered arrangement of components of a test fixture, further including a hot plate, according to embodiments of the disclosure.
Figure 8:
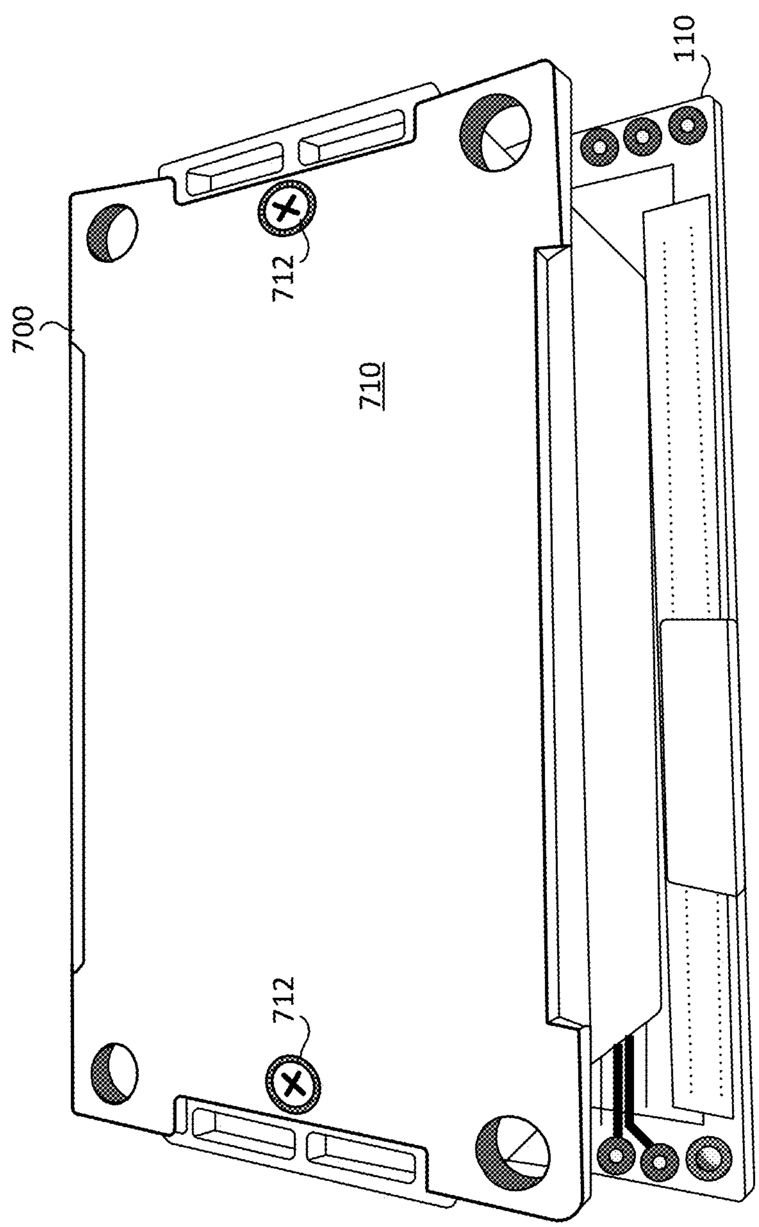
FIG. 8 is a top perspective view of the test fixture of FIG. 7, according to embodiments of the disclosure.

FIG. 7 illustrates a layered arrangement of components of a test fixture 700 according to embodiments of the disclosure. The test fixture 700 is similar to the fixtures described above, except the test fixture 700 includes a heating or hot plate 710. The hot plate 710 may be used in conjunction with any of the test fixtures described above. In some embodiments the hot plate 710 is height-adjustable to accommodate DUTs 790, 792 having different thicknesses. The hot plate 710 is structured to increase the temperature of the DUTs 790, 792 for performing certain measurements or tests at temperatures in excess of room temperatures. The hot plate 710 may be a resistive electrical element that generates heat based on current flowing through it, or it may generate heat in another way. In some embodiments the hot plate 710 does not generate heat itself, but carries heat generated from another source to the DUTs 790, 792. A temperature of the hot plate 710 is generally controlled by the user, who specifies the desired temperature for the DUTs 790, 792. In some embodiments it is possible that the hot plate 710 can be used as a heat sink, removing heat from the DUTs 790, 792 to reduce their operating temperature. FIG. 8 is a top perspective view of the test fixture 700 of FIG. 7, showing the hot plate 710 attached to the test fixture 700 through a pair of screws 712. Of course, the hot plate 710 may be attached to the test fixture in any manner, depending on the implementation. In other embodiments the heating plate is not attached, but may be clamped or may merely rest on the test fixture 700. In general, the hot plate 710 rests or is height adjusted to be very close to the DUTs 790, 792 (FIG. 7) to control the temperature of the DUTs during testing, as described above.

EXAMPLES

Illustrative examples of the disclosed technologies are provided below. A particular configuration of the technologies may include one or more, and any combination of, the examples described below.

Example 1 is a test fixture for coupling a Device Under Test (DUT) to a measurement instrument, the test fixture including a device interface board for electrically connecting to one or more DUTs, a power delivery section electrically coupled to the device interface board through a series of electrical contacts, a measurement interface section electrically coupled to the device interface board through a second series of electrical contacts, the measurement interface structured to be coupled to the measurement instrument, and a metal plate coupled between and providing an electrical return path between the measurement interface and the power delivery section.

Example 2 is a test fixture according to Example 1, in which the metal plate is a solid piece of copper or copper alloy.

Example 3 is a test fixture according to any of the preceding Examples, in which the metal plate has a thickness between approximately 3 to 10 mm.

Example 4 is a test fixture according to any of the preceding Examples, in which the metal plate is structured to carry at least 1 kA of current.

Example 5 is a test fixture according to any of the preceding Examples, further comprising an insulator separating the device interface board from the electrical return path.

Example 6 is a test fixture according to Example 5, in which the insulator has a thickness within a range of between approximately 5 μm and 1 mm.

Example 7 is a test fixture according to any of the preceding Examples, further comprising one or more capacitors coupled to the power delivery section and structured to provide energy to test the one or more DUTs.

Example 8 is a test fixture according to any of the preceding Examples, in which the series of electrical contacts and the second series of electrical contacts are solderless contacts.

Example 9 is a test fixture according to Example 8, in which the series of electrical contacts and the second series of electrical are each formed from a strip of copper having a length over 50% the width of the device interface board.

Example 10 is a test fixture according to Example 9, in which at least one of the strips of copper has a non-planar shape.

Example 11 is a test fixture for coupling a Device Under Test (DUT) to a measurement instrument, the test fixture including a power delivery section configured to be coupled to an energy source for testing one or more DUTs, a measurement interface section configured to be coupled to the measurement instrument, and a press-fit device interface board for electrically connecting to one or more DUTs, the press-fit device interface board electrically coupled to the power delivery section and to the measurement interface section by first and second contacts that establish an electrical connection without solder.

Example 12 is a test fixture according to Example 11, in which the first and second contacts each comprise a series of electrical contacts formed from a strip of copper having a length over 50% the width of the device interface board.

Example 13 is a test fixture according to Example 12, in which at least one of the strips of copper has a non-planar shape.

Example 14 is a test fixture according to any of the preceding Examples 11-13, further comprising an electrical return path between the measurement interface and the power delivery section.

Example 15 is a test fixture according to Example 14, further comprising an insulator disposed between the device interface board and the electrical return path.

Example 16 is a test fixture according to Example 15, in which the insulator has a thickness within a range of between 5 μm and 1 mm.

Example 17 is a test fixture according to any of the preceding Examples 14-16, in which the electrical return path is a metal plate having a thickness between approximately 3 to 10 mm.

Example 18 is a test fixture according to Example 17, in which the metal plate is a solid piece of copper or copper alloy.

Example 19 is a test fixture according to Examples 17-18, in which the metal plate is structured to carry at least 1 kA of current.

Example 20 is a test fixture according to any of the preceding Examples 11-19, further comprising one or more capacitors coupled to the power delivery section and structured to provide energy to test the one or more DUTs.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Further, directions such as "left," "right," "top," and "bottom" are used for convenience and in reference to the views provided in figures. But the disclosed technology may have a number of orientations in actual use. Thus, a feature that is on top or on the bottom in the figures may not have that same orientation or direction in actual use.

Although specific examples of the invention have been illustrated and described for purposes of illustration, it will be understood that various modifications may be made without departing from the spirit and scope of the invention. Accordingly, the invention should not be limited except as by the appended claims.

What is claimed is:

1. A test fixture for coupling one or more Devices Under Test (DUTs) to a measurement instrument, the test fixture comprising:

a device interface board for electrically connecting to the one or more DUTs;

a power delivery section formed on a substrate and electrically coupled to the device interface board through a series of electrical contacts, the power delivery section having a first planar conductor on a first side of the substrate and a second planar conductor on a second side of the substrate opposite the first side, wherein the device interface board is coupled to the first planar conductor on the first side of the power delivery section;

a measurement interface section electrically coupled to the device interface board through a second series of electrical contacts, the measurement interface section structured to be coupled to the measurement instrument; and a metal plate coupled between and providing an electrical return path between the measurement interface section and the power delivery section, wherein the metal plate is coupled to the second planar conductor on the second side of the power delivery section.

2. The test fixture according to claim 1, in which the metal plate is a solid piece of copper or copper alloy.

3. The test fixture according to claim 1, in which the metal plate has a thickness between approximately 3 to 10 mm.

4. The test fixture according to claim 1, in which the metal plate is structured to carry at least 1 kA of current.

5. The test fixture according to claim 1, further comprising an insulator separating the device interface board from the electrical return path.

6. The test fixture according to claim 5, in which the insulator has a thickness within a range of between approximately 5 μm and 1 mm.

7. The test fixture according to claim 1, further comprising one or more capacitors coupled to the power delivery section and structured to provide energy to test the one or more DUTs.

8. The test fixture according to claim 1, in which the series of electrical contacts and the second series of electrical contacts are solderless contacts.

9. The test fixture according to claim 8, in which the series of electrical contacts and the second series of electrical are each formed from a strip of copper having a length over 50% the width of the device interface board.

10. The test fixture according to claim 9, in which at least one strip of copper has a non-planar shape.

11. A test fixture for coupling one or more Devices Under Test (DUTs) to a measurement instrument, the test fixture comprising:

a power delivery section formed on a substrate, the power delivery section configured to be coupled to an energy source for testing the one or more DUTs;

a measurement interface section configured to be coupled to the measurement instrument; and a press-fit device interface board for electrically connecting to the one or more DUTs, the press-fit device interface board electrically coupled to the power delivery section and to the measurement interface section without solder by pressing a first planar conductor of the press-fit device interface board to a planar conductor of the power delivery section to form a first contact and by pressing a second planar conductor of the press-fit device interface board to a planar conductor of the measurement interface section to form a second contact.

12. The test fixture according to claim 11, in which the first and second contacts each comprise a series of electrical contacts formed from a strip of copper having a length over 50% the width of the device interface board.

13. The test fixture according to claim 12, in which at least one of the strips of copper has a non-planar shape.

14. The test fixture according to claim 11, further comprising an electrical return path between the measurement interface section and the power delivery section.

15. The test fixture according to claim 14, further comprising an insulator disposed between the device interface board and the electrical return path.

16. The test fixture according to claim 15, in which the insulator has a thickness within a range of between 5 μm and 1 mm.

17. The test fixture according to claim 14, in which the electrical return path is a metal plate having a thickness between approximately 3 to 10 mm.

18. The test fixture according to claim 17, in which the metal plate is a solid piece of copper or copper alloy.

19. The test fixture according to claim 17, in which the metal plate is structured to carry at least 1 kA of current.

20. The test fixture according to claim 11, further comprising one or more capacitors coupled to the power delivery section and structured to provide energy to test the one or more DUTs.

* * * * *